(12) United States Patent
Bhushan et al.

(10) Patent No.: US 8,310,269 B2
(45) Date of Patent: Nov. 13, 2012

(54) MEASUREMENT OF PARTIALLY DEPLETED SILICON-ON-INSULATOR CMOS CIRCUIT LEAKAGE CURRENT UNDER DIFFERENT STEADY STATE SWITCHING CONDITIONS

(75) Inventors: Manjul Bhushan, Hopewell Junction, NY (US); Mark B. Ketchen, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 12/544,730

(22) Filed: Aug. 20, 2009

(65) Prior Publication Data

US 2011/0043243 A1 Feb. 24, 2011

(51) Int. Cl.
*G01R 31/26* (2006.01)
*G01R 31/3187* (2006.01)
(52) U.S. Cl. .................... 324/762.02; 324/750.3
(58) Field of Classification Search .. 324/762.01–762.1, 324/750.01–750.3; 714/716, 724; 326/15–16
See application file for complete search history.

(56) References Cited

U.S. PATENT DOCUMENTS

| | | | |
|---|---|---|---|
| 6,219,305 B1 * | 4/2001 | Patrie et al. .................. | 368/113 |
| 6,765,839 B2 * | 7/2004 | Park .............................. | 365/222 |
| 6,777,708 B1 | 8/2004 | Lin et al. | |
| 7,504,896 B2 | 3/2009 | Bhushan et al. | |
| 7,517,743 B2 | 4/2009 | Wang et al. | |
| 7,843,206 B2 * | 11/2010 | Hyobu ........................ | 324/750.3 |

OTHER PUBLICATIONS

Measurement of Idle-state and Steady-state Leakage Power in Partially-Depleted Silicon on Insulator (PD-SOI) CMOS Technology; IP.COM; Jun. 2009.
M. B. Ketchen et al.; "Circuit and technique for characterizing switching delay history effects in silicon-on-insulator logic gates;" Review of Scientific Instruments, vol. 75, No. 3, Mar. 2004; pp. 1-4.
M. Ketchen et al.; "High Speed Test Structures for In-Line Process Monitoring and Model Calibration;" IEEE International Conference on Microelectronic Test Structures; Apr. 2005; pp. 33-38.
M. B. Ketchen et al.; "Product-representative "at speed" test structures for CMOS characterization;" IBM Journal of Research and Development, vol. 50, No. 4/5, Jul. / Sep. 2006; pp. 451-468.
K. K. Kim et al.; "A Novel Statistical Timing and Leakage Power Characterization of Partially-Depleted Silicon-On-Insulator (SOI) Gates;" IEEE Transactions on Instrumentation and Measurement, Feb. 2009; pp. 401-410.
N. H. E. Weste et al.; Principles of CMOS VLSI Design a Systems Perspective; 2nd Edition Addison-Wesley Publishing Company 1992; p. 336.

(Continued)

*Primary Examiner* — Tung X Nguyen
(74) *Attorney, Agent, or Firm* — Cantor Colburn LLP; Vazken Alexanian

(57) ABSTRACT

A test system for determining leakage of an integrated circuit (IC) under test includes a test circuit formed on a same chip as the IC, the test circuit further having pulse generator configured to generate a high-speed input signal to the IC at a plurality of selectively programmable duty cycles and frequencies, the IC powered from a first power source independent from a second power source that powers the pulse generator; and a current measuring device configured to measure leakage current through the IC in a quiescent state, and current through the IC in an active switching state, responsive to the high-speed input signal at a plurality of the programmable duty cycles and frequencies, and wherein the test circuit utilizes only external low-speed input and output signals with respect to the chip.

22 Claims, 5 Drawing Sheets

OTHER PUBLICATIONS

K. K. Das et al.; "Ultra Low-Leakage Power Strategies for Sub-1 V VLSI: Novel Circuit Styles and Design Methodologies for Partially Depleted Silicon-On-Insulator (PD-SOI) CMOS Technology;" IEEE Proceedings of the 16th International Conference on VLSI Design (VLSI'03); pp. 291-296; 2003.

"Measurement of Idle-state and Steady-state Leakage Power in Partially-Depleted Silicon on Insulator (PD-SOI) CMOS Technology," IP.COM; Jun. 2009.

K. K. Kim et al.; "Probabilistic Leakage Power Estimation of Partially-Depleted Silicon-On-Insulator (SOI) Gates;" 50th Midwest Symposium on Circuits and Systems, MWSCAS 2007, pp. 980-983; Aug. 2007.

M. Kitamura et al.; "High Performance CMOS Circuit by Using Charge Recycling Active Body-Bias Controlled SOI;" Lecture Notes in Computer Science; 2006; pp. 393-402; Sep. 2006.

* cited by examiner

MEASUREMENT OF PARTIALLY DEPLETED SILICON-ON-INSULATOR CMOS CIRCUIT LEAKAGE CURRENT UNDER DIFFERENT STEADY STATE SWITCHING CONDITIONS

BACKGROUND

The present invention relates generally to integrated circuit devices and, more particularly, to measurement of partially depleted silicon-on-insulator CMOS circuit leakage power under different steady state switching conditions.

For complementary metal oxide semiconductor (CMOS) products manufactured in partially depleted silicon-on-insulator (PDSOI) technology, the leakage power in the idle state may be different than the leakage power in the operating state because of metal oxide semiconductor field effect transistor (MOSFET) threshold voltage dependency on switching history. The switching frequency of circuits and the duty cycle vary considerably across the product, and thus the leakage power of the product cannot be simply derived from the quiescent leakage current (Iddq) measurements as is the case for bulk silicon technology.

In a CMOS circuit in PDSOI technology, the delay is dependent on its switching history. When a circuit first switches after sitting idle for a few ms or more (the first switch being referred to as "1SW" herein) it will have a longer or shorter delay than when it switches again within a few nanoseconds (the second switch being referred to as "2SW" herein). If the same circuit is switching on a regular basis, every few nanoseconds (ns) or less, it will have a third delay characteristic of steady-state (SS) operation. This steady state delay will itself depend on the details of the repetitive switching pattern.

The variations in delay are as a result of shifts in the MOSFET threshold voltage arising from floating body-effects. The shifts in MOSFET threshold voltages based on circuit switching history also result in shifts in the leakage currents. Accordingly, a CMOS product in an idle state will have a different leakage power (leakage current×power supply voltage) than when it is in a "working state" when the circuits are switching. The differences in leakage power may be substantial. For example, a 20 millivolt (mV) shift in threshold voltage and associated 2.5% change in delay correspond to 50% increase in leakage current, which translates to a 50% increase in leakage power. Thus, in order to project the leakage power of a product in its operating state, the leakage current in the idle state (IS) and in the steady state (SS), with different frequencies and pulse widths, should be monitored in the manufacturing line on a regular basis.

The measurement of SOI switching history to get leakage current estimates requires input pulse widths of a few nanoseconds or less along with picosecond (ps) time resolution. It also requires knowledge of the dependence of history and current on threshold voltage for the hardware under consideration. Typically, such history measurements have been made as bench tests on limited hardware using high speed probing techniques and equipment. These measurements are difficult to perform during processing in a manufacturing environment, due to such problems as noise, shielding, and test time. Bench measurements have shown that the PD-SOI history is often 10-15% in present PDSOI CMOS technologies, and it is a strong function of device design. In addition, history variation across a wafer may be in excess of 5%. Recently, a scheme has been described for measuring SOI 1SW-2SW history using a self-calibrating, self-timed technique with direct current (DC) signal inputs and outputs. Such a circuit, however, does not allow direct measurement or inference of leakage current under different steady state switching conditions.

SUMMARY

In an exemplary embodiment, a test system for determining leakage of an integrated circuit (IC) under test includes a test circuit formed on a same chip as the IC, the test circuit further having pulse generator configured to generate a high-speed input signal to the IC at a plurality of selectively programmable duty cycles and frequencies, the IC powered from a first power source independent from a second power source that powers the pulse generator; and a current measuring device configured to measure leakage current through the IC in a quiescent state, and current through the IC in an active switching state, responsive to the high-speed input signal at a plurality of the programmable duty cycles and frequencies, and wherein the test circuit utilizes only external low-speed input and output signals with respect to the chip.

In another embodiment, a method of determining leakage of an integrated circuit (IC) under study includes measuring quiescent leakage current (Iddq) through the IC upon power up of the IC; inputting a high-speed input signal to the IC, the high-speed input signal having a first duty cycle and a first frequency; measuring an active current (Idda) through the IC, responsive to the high-speed input signal at the first duty cycle and first frequency; altering the high-speed input signal one or more times to generate one or more different duty cycles, with respect to the first duty cycle, and measuring Idda for each different duty cycle, at the first frequency; altering the high-speed input signal to the IC to a second frequency at the first duty cycle and thereafter measuring Idda of the IC; based on the measured Idda at the first duty cycle and first frequency and the measured Idda at the first duty cycle and second frequency, determining a change in Iddq of the IC at the first duty cycle; and based on the change in Iddq of the IC at the first duty cycle and first frequency and the measured Idda values at the first frequency and the one or more different duty cycles, determining a change in Iddq and a new steady state leakage current (Iddqs) at the first frequency and the one or more different duty cycles.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a test circuit and a methodology for routinely measuring the leakage current of an integrated circuit (e.g., one formed in PDSOI) in its quiescent state, as well as in a variety of steady state operating conditions. One feature of the test circuit is that pulse width and frequency in steady state operation may be varied to represent various switching scenarios in a CMOS product.

In an exemplary embodiment, the test circuit includes a pulse generator having a programmable duty cycle and period. The output of the pulse generator is fed into a delay chain having an even number of inverting CMOS logic gates. The leakage current of the delay chain, which is powered by an isolated power source, is first measured in the quiescent state, giving a value of quiescent leakage current, Iddq. The steady state active current, Idda, of the chain is then measured for different duty cycles and frequencies of the pulse generator drive, from which the values of the leakage current, under the various steady state operating conditions, Iddqs, are determined. The procedure is repeated at different delay chain power supply voltages to obtain the voltage dependence as well. The circuit scheme need only utilize low-speed I/O's and can be used for monitoring the technology in the manufacturing line using a conventional parametric tester.

As used herein, the term "high-speed" with respect to a signal generally refers to a signal having rise and fall times on the order of about 150 picoseconds or less, and more specifically on the order of about 10s of picoseconds to less than 10 picoseconds for signals internal to the test circuit and the IC under test. In contrast, the term "low-speed" with respect to a signal generally refers to a signal having rise and fall times on the order of about 100 nanoseconds or more.

Figure 1:
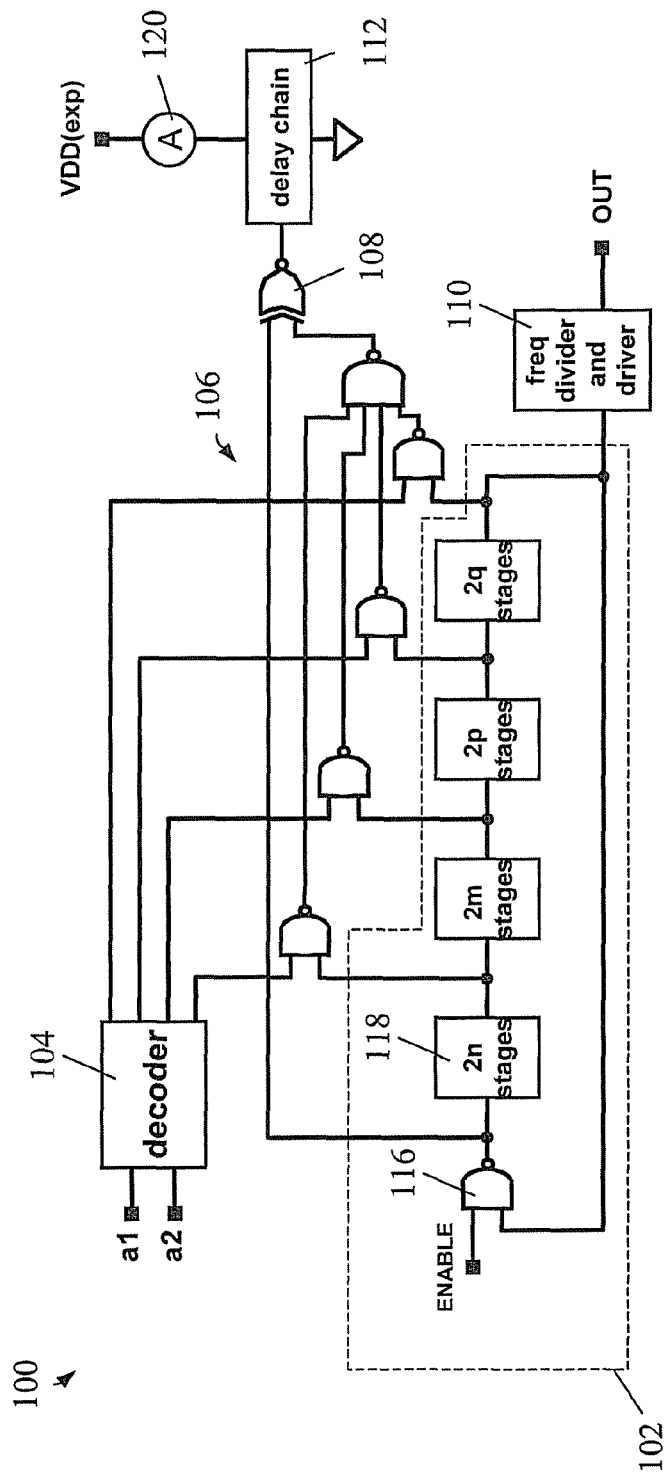
FIG. 1 is a schematic diagram of a test circuit configured to measure the leakage power of an integrated circuit (IC) in its quiescent state, as well as in a variety of steady state operating conditions, in accordance with an embodiment of the invention.
Figure 2:
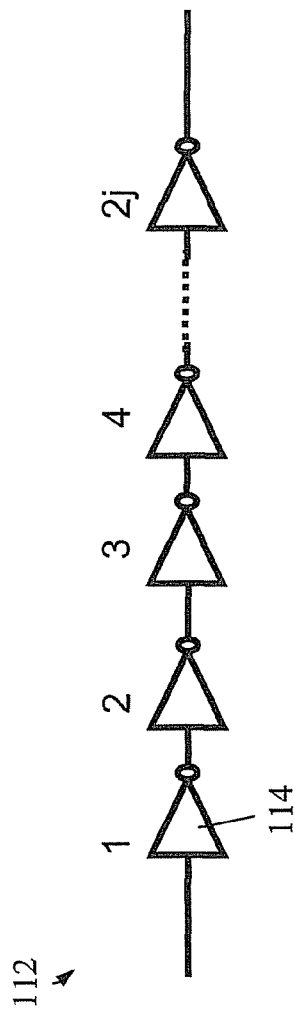
FIG. 2 is a schematic diagram illustrating a portion of the delay chain (IC) of FIG. 1 in further detail.

Referring initially to FIG. 1, there is shown a schematic diagram of an on-chip test circuit 100 configured to measure the leakage power of an integrated circuit (IC) in its quiescent state, as well as in a variety of steady state operating conditions, in accordance with an embodiment of the invention. The terminology "on-chip" refers to the test circuit itself being formed on the same chip as the IC under test. As is shown, the test circuit 100 includes a variable frequency ring oscillator 102, a decoder 104, a multiplexer 106, an exclusive NOR (XNOR) gate 108 to generate pre-selected pulse widths, and a frequency divider 110 coupled to the variable frequency ring oscillator 102 to enable monitoring of the variable frequency ring oscillator frequency via a low frequency output signal. A delay chain 112 is also illustrated in FIG. 1, representing an example of the IC under test. The delay chain 112, as shown in further detail in FIG. 2, includes an even number of inverting CMOS gates 114 under test.

Figure 3:
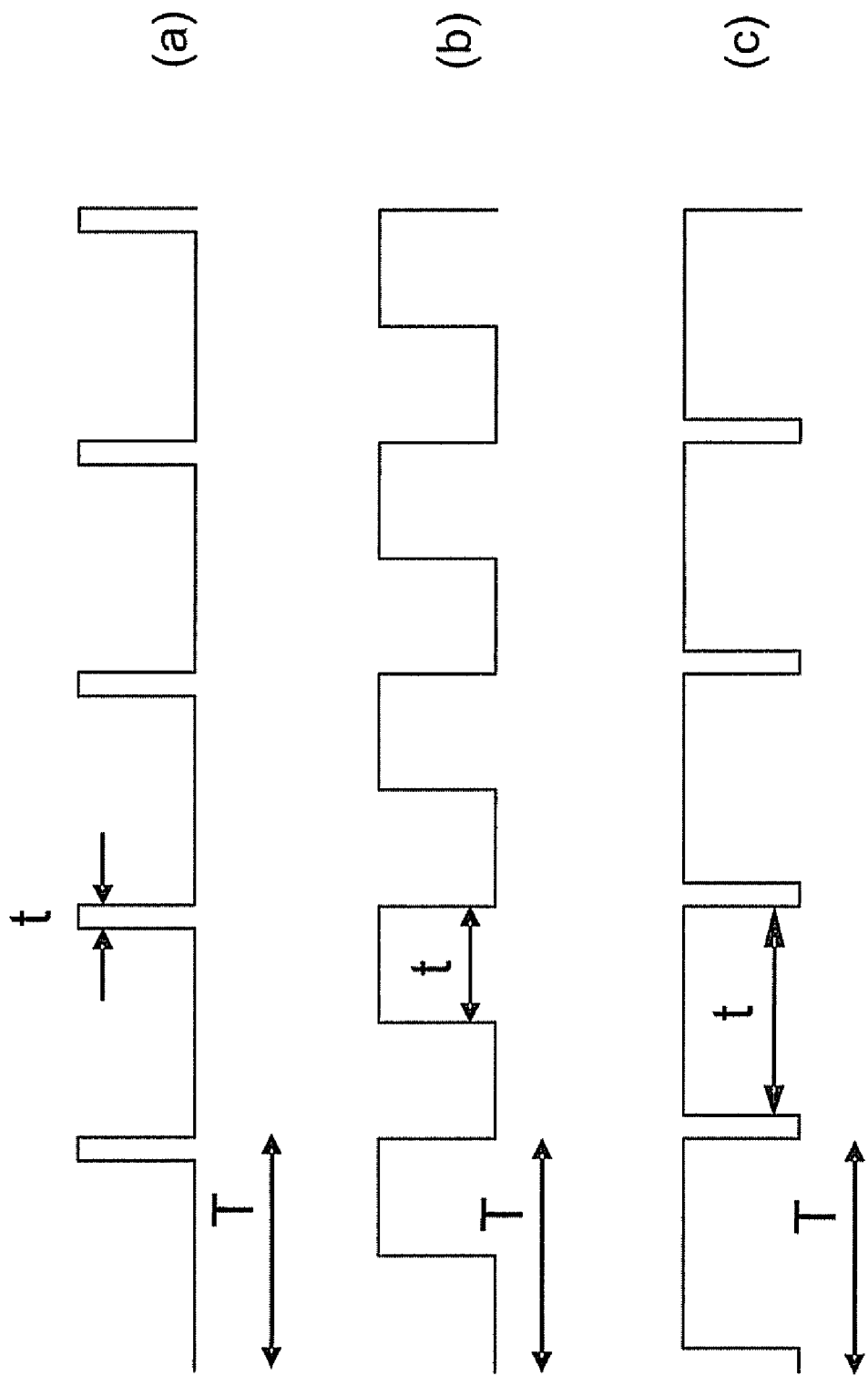
FIG. 3 illustrates exemplary drive waveforms with varying duty cycles that may be generated by the test circuit of FIG. 1.

Referring again to FIG. 1, the delay chain 112 is tied to an independent power supply, VDD(exp), while the rest of the test circuitry 100 operates on a different power supply, VDD (not shown). In operation, the variable frequency ring oscillator 102 is enabled whenever the ENABLE pin of the NAND gate 116 portion of the variable frequency ring oscillator 102 is set at "1". In addition to the NAND gate 116, the variable frequency ring oscillator 102 is divided into sections 118 (2n, 2m, 2p, 2q) each with an even number of inverting stages. The voltage signals from the two ends of each section 118 are applied to the XNOR gate 108 (through NAND logic in the multiplexer 106) to generate pulses of width equal to the delay of these gates. The time interval between the pulses is equal to one-half of the period of the variable frequency ring oscillator 102. The pulses are launched on the delay chain 112 and the current drawn by the power supply VDD(exp) of the delay chain is measured using a current measuring device such as ammeter 120. The decoder 104 and multiplexer 106 in combination are used to select pulses of different widths. For a constant pulse period, the fractional pulse width or duty cycle (dcl) of the drive to the delay chain 112 is given by, for example:

$$dcl = t/T = 2tf = tfD = 2n/(2n+2m+2p+2q+1) \quad [1]$$

where 2n, 2m, 2p and 2q are the numbers of stages in different sections 118 of the variable frequency ring oscillator 102 as indicated above, t and T are the pulse width and pulse period, respectively, f is the frequency of the variable frequency ring oscillator 102, and fD=2f is the pulse frequency. The decoder 104 may have a number, k, of input bits (a1, a2, . . . , ak) for selecting $2^k$ different pulse widths. Exemplary drive waveforms with duty cycles of (a) 0.1, (b) 0.5 and (c) 0.9 are shown in FIG. 3. It should be appreciated that the waveform applied to half of the gates in the delay chain 112 will be the logical inverse of the input drive waveform because of the inverting property of the gates.

The period, T, (and thus frequency) of the variable frequency ring oscillator 102 may be changed by varying the value of its power supply voltage, VDD. Alternatively, each stage 118 of the variable frequency ring oscillator 102 may be embodied by a current starved inverter with the voltage bias on the inverter being used to vary the variable frequency ring oscillator period. Again, as indicated above, in order to measure the variable frequency ring oscillator frequency f=½T, the variable frequency ring oscillator signal is fed to the frequency divider circuit 110 to reduce f to below 1 MHz so that it may be easily measured using a standard off-the-shelf frequency counter through a low-speed output line.

The measured Idda of the delay chain 112 is the sum of the leakage current of all gates in the chain, plus the sum of average capacitive charging current and the short circuit current of one switching gate in the delay chain 112. Since only one gate is switching at a given time within the chain, and since the number of switching events in the chain is independent of the drive duty cycle, the charging and short-circuit currents are thus the same for different drive duty cycles. The change in Iddq from one duty cycle to the next, at a constant frequency, is determined from the change in Idda.

Figure 4:
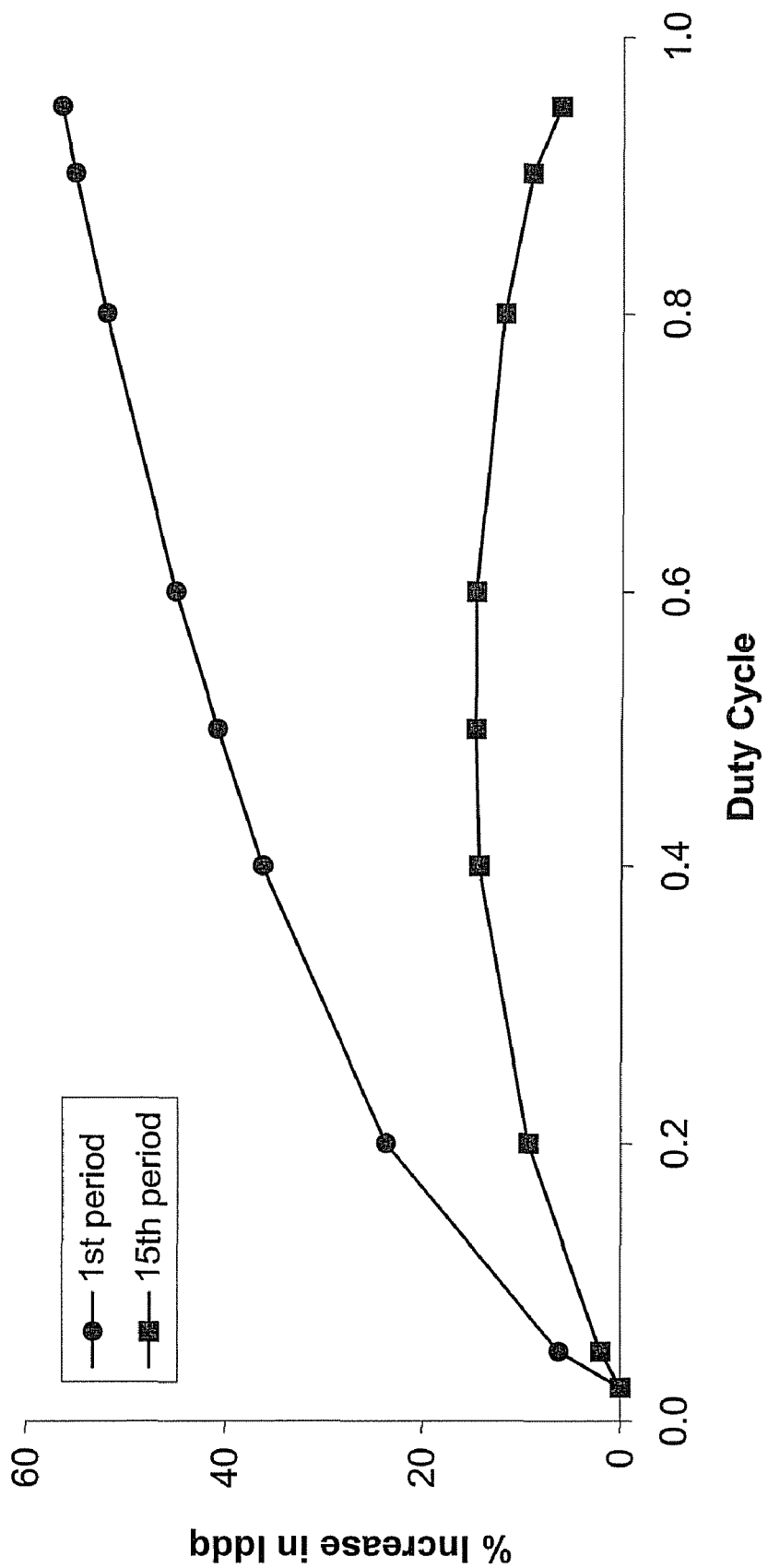
FIG. 4 is a graph that plots the simulated increase in Iddq vs. drive duty cycle during the first and $15^{th}$ periods of the applied pulse sequence.

As an illustrative example, FIG. 4 is a graph that plots the simulated increase in Iddq vs. drive duty cycle during the first and $15^{th}$ periods of the variable frequency ring oscillator pulse sequence. Here, the fractional increase in Iddq is given by:

$$(Idda\_2 - Idda\_1)/Iddq \quad [2]$$

where Idda_1 is the active current for duty cycles <0.01 and Idda_2 is the active current for a value of the duty cycle ≧0.01. For the purposes of this example it is assumed that for all very small duty cycles (<0.01), the leakage current is equal to the quiescent Iddq (pre-1SW conditions), which will not necessarily be true in general. The switching current, Iddsw, scales with frequency, but is independent of duty cycle; hence:

$$Idda\_1 = Iddq + Iddsw \quad [3]$$

$$Idda\_2 = Iddq + Iddsw + \Delta Iddq \quad [4]$$

In the simulation model, it is assumed that the 1SW is slower than the 2SW. After the first switching event (i.e., the rising edge of the drive pulse), there is a large increase in Iddq as the threshold voltage is lowered due to the increased forward bias voltage of the MOSFET floating body. The Iddq is returned very close to its pre-1SW value after the second switching event (i.e., the falling edge of the drive pulse). After a time interval of several periods and repeated switching events, the floating body voltages of the MOSFETs in the CMOS gates begin to approach the steady state value, which is somewhere between the 1SW and 2SW values. For long running times, this plot will become symmetric about a drive duty cycle of 0.5, at which point the steady state leakage current value reaches a maximum.

Typically, the Idda measurements are made several milliseconds (ms) after enabling the variable frequency ring oscillator 102. With a typical pulse period of 1-10 nanoseconds at the time of measurement, all MOSFETs would have reached the steady state conditions for the applied drive duty cycle.

Figure 5:
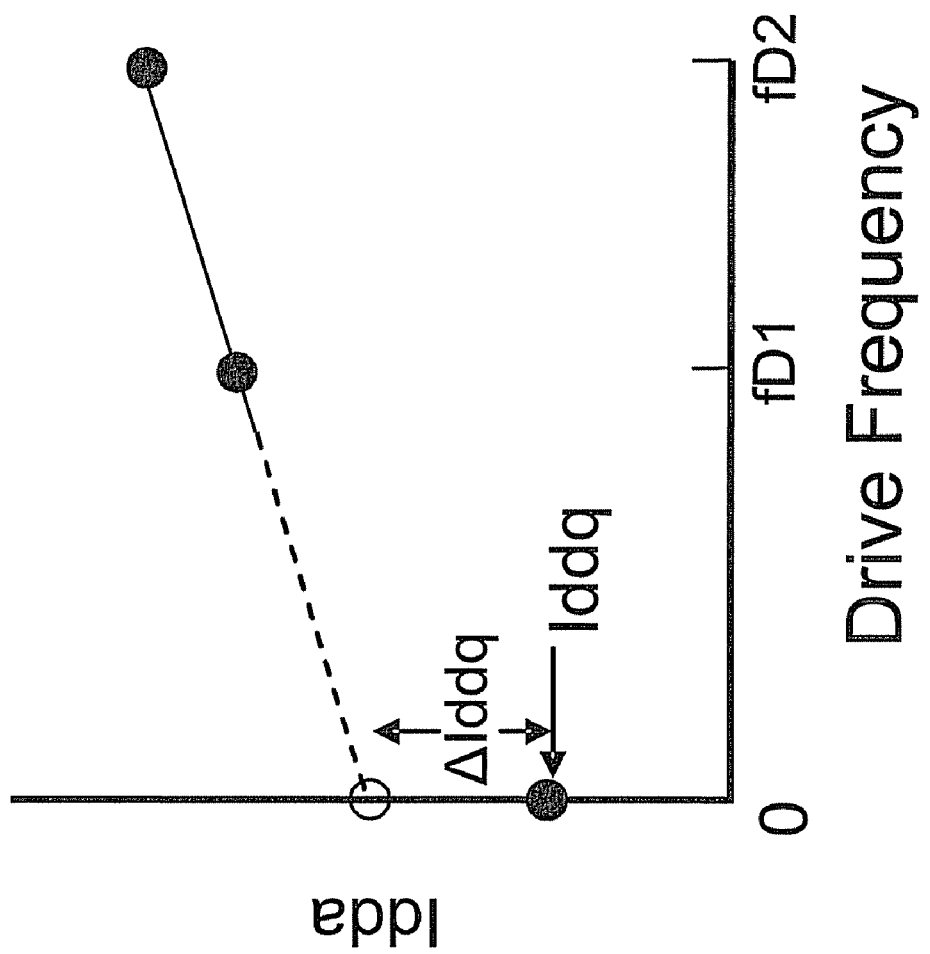
FIG. 5 is a graph illustrating an experimental extrapolation technique for determining ΔIddq, in accordance with a further embodiment of the invention.

An experimental technique for determining the actual $\Delta Iddq$ is to measure Idda for the same duty cycle (for example, dcl=0.5) at two nearby drive frequencies separated by, for example, 10% and then extrapolating the Idda vs. drive frequency (fD) plot as shown in FIG. 5. Since Iddsw is proportional to fD (for small frequency changes), the difference between the zero-frequency intercept and the measured Iddq under non-switching conditions is just $\Delta Iddq$ (dcl=0.5). Once $\Delta Iddq$ (dcl=0.5) is known at a particular fD, the $\Delta Iddq$ values at other values of dcl can be calculated from the corresponding measured Idda values as:

$$\Delta Iddq(dcl) = \Delta Iddq(dcl=0.5) + [Idda(dcl) - Idda(dcl=0.5)], \quad [5]$$

and the corresponding steady state leakage current, Iddqs, is obtained by adding the value of the quiescent Iddq to the $\Delta Iddq(dcl)$ value:

$$Iddqs(dcl) = Iddq + \Delta Iddq(dcl) \quad [6]$$

The number of gates in the delay chain should be sufficiently large (e.g., 20-50) to minimize measurement errors. However, the pulse width of the drive signal must be larger than the time to traverse a signal across the delay chain to ensure that only one switching event occurs at a time. Additionally, the delay chain must not be so long as to substantially alter the pulse width during traversal due to history effect. The gates may, on the one hand, be identical for calibrating the model for specific gate types or may be different to reflect some representative path composition.

Figure 6:
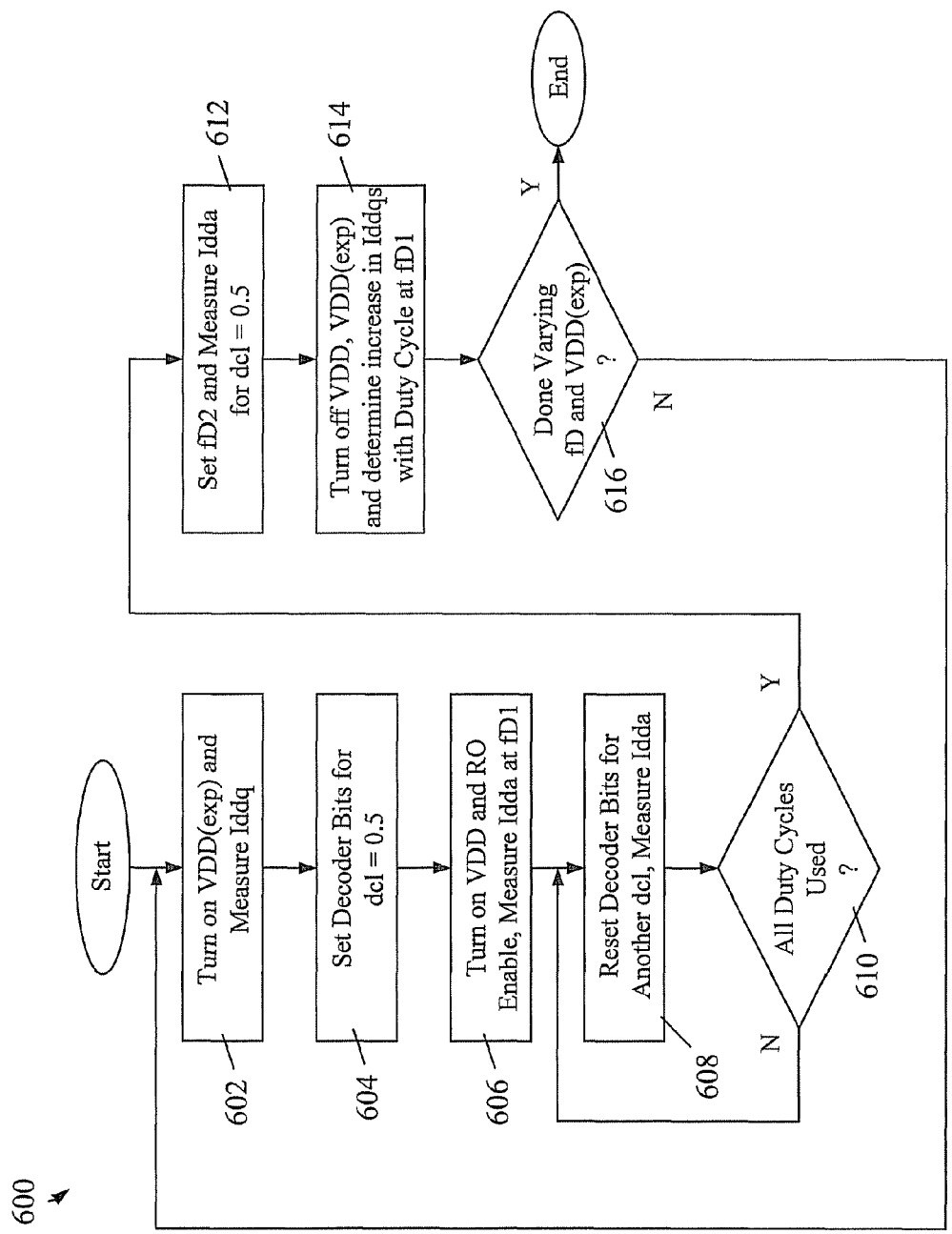
FIG. 6 is a flow diagram illustrating a method for measuring the change in Iddq of an IC device under different steady state switching conditions, in accordance with a further embodiment of the invention.

Finally, FIG. 6 is a flow diagram illustrating a method 600 for measuring the change in Iddq of an IC device under different steady state switching conditions, in accordance with a further embodiment of the invention. It should be appreciated that the although the methodology may be used in conjunction with the test circuit 100 depicted in FIG. 1, it is equally contemplated that it could be used with different configurations of on-chip circuitry designed to produce high speed pulses of varying duty cycles for different frequencies, or with appropriate off-chip circuitry providing high speed inputs in a high speed test environment (as opposed to an in-line test environment).

As shown in block 602, the method 600 begins by activating a power supply source specific to the IC device under study (e.g., a delay chain such as the delay chain 112 in FIG. 1) and measuring the quiescent leakage current therethrough, Iddq. Then, as shown in block 604, the decoder bits (e.g., a1, a2 of FIG. 1) are set so as to select an input waveform having a duty cycle of 0.5. Using this waveform, the VDD supply for the test (waveform generating) circuit is activated and the variable frequency ring oscillator portion of the test circuit is enabled, after which the active current, Idda, of the IC device under study is measured at generated waveform frequency and at the 0.5 duty cycle as reflected in block 606. Then, the duty cycle of the input waveform (still at the first frequency fD1) is varied and Idda is again measured at the new duty cycle, as shown in block 608.

Depending on the resolution capability of the test circuit, in terms of the number of discrete duty cycle values capable of being generated, the process of measuring Idda for different duty cycles is repeated until all duty cycles for the first frequency have been used, as reflected in decision block 610. At this point, the method 600 then proceeds to block 612, where the Idda of the IC device under study is measured using a different frequency, fD2, and at a duty cycle of 0.5. With this information, a change in leakage current, $\Delta Iddq$, for the first drive frequency fD1 can now be determined as indicated in block 614 using the back extrapolation technique illustrated by the plot of FIG. 5. The steady state leakage currents for all measured duty cycles at fD1 can then be determined by the method described in conjunction with Equations 5 and 6.

The above sequence may then be repeated, for different values of drive frequency and VDD(exp) such that the method 600 returns back to block 602 or exits once all different values of fD and VDD(exp) have been used.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A test system for determining leakage of an integrated circuit (IC) under test, comprising:
   a test circuit formed on a same chip as the IC, the test circuit further comprising pulse generator configured to generate a high-speed input signal to the IC at a plurality of selectively programmable duty cycles and frequencies, the IC powered from a first power source independent from a second power source that powers the pulse generator;
   the pulse generator comprising a variable frequency ring oscillator divided into a signal-enabled inverting gate and a plurality of sections, each section having an even number of inverting stages, a decoder configured to receive input bits corresponding to a selected duty cycle, and a multiplexer having logic coupled to the decoder and to the stages of the variable frequency ring oscillator, the multiplexer and decoder operative to generate from the variable frequency ring oscillator a pulse having a width according to the selected duty cycle and the frequency of a variable frequency ring oscillator; and
   a current measuring device configured to measure leakage current through the IC in a quiescent state, and current through the IC in an active switching state, responsive to the high-speed input signal at a plurality of the programmable duty cycles and frequencies, and wherein the test circuit utilizes only external low-speed input and output signals with respect to the chip.

2. The test circuit of claim 1, wherein the plurality of programmable duty cycles includes at least 0.1, 0.5 and 0.9.

3. The test circuit of claim 1, further comprising an exclusive NOR (XNOR) gate with inputs selectively coupled to the nodes at the ends of one of the plurality of sections of the variable frequency ring oscillator, an output of the XNOR gate comprising the high-speed input signal to the IC.

4. The test circuit of claim 1, wherein the IC comprises a delay chain having an even number of inverting logic gates.

5. The test circuit of claim 4, wherein a pulse width of the high-speed input signal is longer than an amount of time for the high-speed input signal to completely traverse the delay chain so as to preclude more than one switching events within the delay chain at a given moment in time.

6. The test circuit of claim 5, wherein the period of the high-speed input signal is about 1 to about 10 nanoseconds.

7. The test circuit of claim 1, wherein the variable frequency ring oscillator is tunable by varying a power supply voltage value thereto.

8. The test circuit of claim 1, wherein the variable frequency ring oscillator comprises current starved inverters for tuning the frequency thereof.

9. A method of determining leakage of an integrated circuit (IC) under study, the method comprising:
measuring quiescent leakage current (Iddq) through the IC upon power up of the IC;
inputting a high-speed input signal to the IC, the high-speed input signal having a first duty cycle and a first frequency;
measuring an active current (Idda) through the IC, responsive to the high-speed input signal at the first duty cycle and first frequency;
altering the high-speed input signal one or more times to generate one or more different duty cycles, with respect to the first duty cycle, and measuring Idda for each different duty cycle, at the first frequency;
altering the high-speed input signal to the IC to a second frequency at the first duty cycle and thereafter measuring Idda of the IC;
based on the measured Idda at the first duty cycle and first frequency and the measured Idda at the first duty cycle and second frequency, determining a change in Iddq of the IC at the first duty cycle; and
based on the change in Iddq of the IC at the first duty cycle and first frequency and the measured Idda values at the first frequency and the one or more different duty cycles, determining a change in Iddq and a new steady state leakage current (Iddqs) at the first frequency and the one or more different duty cycles.

10. The method of claim 9, wherein the first duty cycle is 0.5.

11. The method of claim 10, wherein the one or more different duty cycles includes 0.1 and 0.9.

12. The method of claim 9, further comprising repeating the measuring Iddq through the IC upon power up of the IC, the inputting the high-speed input signal to the IC at a first duty cycle, measuring (Idda) through the IC at the first duty cycle, altering the high-speed input signal one or more times to generate one or more different duty cycles and measuring Idda for each different duty cycle, determining a change in Iddq of the IC at the first duty cycle, using one or more different first frequencies and one or more altered values of power supply voltage for the IC, and then determining the change in Iddq and the corresponding steady state leakage Iddqs values using one or more different first frequencies and one or more altered values of power supply voltage for the IC.

13. The method of claim 9, wherein the IC is formed on a partially depleted, silicon-on-insulator substrate.

14. The method of claim 13, wherein the IC comprises a delay chain having an even number of inverting logic gates.

15. The method of claim 14, further comprising generating the high-speed input signal with a pulse generator configured having a plurality of selectively programmable duty cycles and frequencies, wherein the IC is powered from a first power source independent from a second power source that powers the pulse generator.

16. The method of claim 15, wherein the pulse generator further comprises:
a variable frequency ring oscillator divided into a signal-enabled inverting gate and a plurality of sections, each section having an even number of inverting stages;
a decoder configured to receive input bits corresponding to a selected duty cycle; and
a multiplexer having logic coupled to the decoder and to the stages of the variable frequency ring oscillator, the multiplexer and decoder operative to generate from the variable frequency ring oscillator a pulse having a width according to the selected duty cycle.

17. The method of claim 14, wherein the high-speed input signal to the IC is an output of an exclusive NOR (XNOR) gate with inputs selectively coupled to the nodes at the ends of one of the plurality of sections of the variable frequency ring oscillator.

18. The method of claim 14, wherein a pulse width of the high-speed input signal is longer than an amount of time for the high-speed input signal to completely traverse the delay chain so as to preclude more than one switching event within the delay chain at a given moment in time.

19. The method of claim 14, wherein the period of the high-speed input signal is about 1 to about 10 nanoseconds.

20. The method of claim 9, wherein the estimating a change in Iddq of the IC at the first duty cycle further comprises extrapolating a plot of Idda versus high-speed input signal frequency determined at a first and a second frequency, at the first duty cycle, back to a direct current (DC) frequency value.

21. The method of claim 20, wherein the first and second frequencies are separated by about 10%.

22. The method of claim 16, further comprising determining the first and second frequencies by measuring the frequency of the variable frequency ring oscillator.

* * * * *